United States Patent
Lin et al.

(10) Patent No.: US 7,652,534 B1
(45) Date of Patent: Jan. 26, 2010

(54) RAIL-TO-RAIL OPERATIONAL AMPLIFIER CAPABLE OF REDUCING CURRENT CONSUMPTION

(75) Inventors: Chia-Hung Lin, Hsinchu (TW);
Jr-Ching Lin, Kao-Hsiung (TW);
Yung-Cheng Lin, Hsinshu County (TW); Tsung-Hau Chang, Hsinchu (TW)

(73) Assignee: NOVATEK Microelectronics Corp., Hsinchu Science Park, Hsin-Chu (TW)

( * ) Notice: Subject to any disclaimer, the term of this patent is extended or adjusted under 35 U.S.C. 154(b) by 0 days.

(21) Appl. No.: 12/263,499

(22) Filed: Nov. 2, 2008

(30) Foreign Application Priority Data

Sep. 1, 2008 (TW) .............................. 97133463 A

(51) Int. Cl.
*H03F 3/45* (2006.01)
(52) U.S. Cl. ...................................... 330/255; 330/261
(58) Field of Classification Search ................. 330/255, 330/257, 261, 51
See application file for complete search history.

(56) References Cited

U.S. PATENT DOCUMENTS 7,154,332 B2 * 12/2006 Tsuchi ........................ 330/255
7,295,069 B2 * 11/2007 Kim ............................ 330/255

* cited by examiner

*Primary Examiner*—Henry K Choe
(74) *Attorney, Agent, or Firm*—Winston Hsu

(57) ABSTRACT

A rail-to-rail operational amplifier capable of reducing current consumption includes an amplification stage circuit including a first compensation output terminal and a second compensation output terminal, for generating an amplified signal according to an input signal, an output stage circuit coupled to the amplification stage circuit, for outputting the amplified signal, and a compensation circuit coupled to the amplification stage circuit and the output stage circuit. The compensation circuit includes a first voltage generator for generating a first voltage, a second voltage generator for generating a second voltage, a first compensation capacitor, a second compensation capacitor, and four switches named from a first switch to a fourth switch, wherein the first voltage is approximately a steady state voltage of the first compensation output terminal and the second voltage is approximately a steady state voltage of the second compensation output terminal.

14 Claims, 7 Drawing Sheets

RAIL-TO-RAIL OPERATIONAL AMPLIFIER CAPABLE OF REDUCING CURRENT CONSUMPTION

BACKGROUND OF THE INVENTION

1. Field of the Invention

The present invention relates to a rail-to-rail operational amplifier, and more particularly, to a rail-to-rail operational amplifier capable of reducing current consumption by controlling bias of compensation capacitors.

2. Description of the Prior Art

With the advance of semiconductor technologies, operating voltages of integrated circuits become lower and lower. For the design of analog circuits, problems of insufficient input and output common-mode voltage of an operational amplifier often occur, and thus the operational amplifier needs to have a rail-to-rail common-mode input and output range to solve these problems.

Generally, a conventional operational amplifier has a two-stage structure, which includes a first stage amplification circuit (amplification stage), and a second stage output circuit (output stage). The first stage amplification circuit is utilized for increasing current or voltage gain of the operational amplifier, and the second stage output circuit is utilized for driving capacitive or resistive loads connected to the operational amplifier. In addition, since the operational amplifier may suffer loop instability problems, Miller compensation capacitors are commonly used to perform frequency compensation for improving loop stability.

Please refer to FIG. 1, which is a schematic diagram of a conventional operational amplifier 10. The operational amplifier 10 is a rail-to-rail operational amplifier including an amplification stage circuit 11, an output stage circuit 12 and a compensation circuit 13. The operational amplifier 10 receives an input signal via a positive input terminal VP, outputs an amplified signal via an output terminal VOUT and forms a feedback path from the output terminal VOUT to a negative input terminal VN. The amplification stage circuit 11 includes a first differential input pair 110, a second differential input pair 120, a first current mirror 130, a second current mirror 140 and a third current mirror 150. The first differential pair 110 includes a pair of matched NMOS transistors MN1 and MN2 and a current source 11 coupled to sources of the transistors MN1 and MN2, which is utilized for providing quiescent currents of the first differential input pair 110. Similarly, the second differential pair 120 includes a pair of matched PMOS transistors MP1 and MP2 and a current source 12 coupled to sources of the transistors MP1 and MP2, which is utilized for providing quiescent currents of the second differential input pair 120.

The first current mirror 130 and the second current mirror 140 are active loads for the first differential input pair 110 and the second differential input pair 120, respectively. The first current mirror 130 includes PMOS transistors MP3, MP4, MP5 and MP6. The second current mirror 140 includes NMOS transistors MN3, MN4, MN5 and MN6. Gates of the transistors MP5, MP6, MN5 and MN6 are all coupled to a bias VB. The third current mirror 150 is represented as current sources 13 and 14, and is utilized for performing summation of output signals from the first differential input pair 110 and the second differential input pair 120 and outputting the summation result to the output stage circuit 12. Operation of the current mirror is well-known to those skilled in the art and explanation is not given here.

The output stage circuit 12 is a class AB push-pull output circuit including a PMOS transistor MP7 and an NMOS transistor MN7, in which gates of the transistors MP7 and MN7 are respectively coupled to a node E and a node F of the amplification stage circuit 11. The compensation circuit 13 is coupled between the amplification stage circuit 11 and the output stage circuit 12 and includes switches S1-S4 and compensation capacitors CM1 and CM2. The switches S1 and S2 and the compensation capacitor CM1 are coupled to a node A; the switch S1 and the amplification stage circuit 11 are coupled to a node B. The switches S3 and S4 and the compensation capacitor CM2 are coupled to a node C; the switch S3 and the amplification stage circuit 11 are coupled to a node D. In the operational amplifier 10, the compensation capacitors CM1 and CM2 are charged and discharged according to switching of the switches S1-S4, which helps loop stability. When the input signal of the operational amplifier 10 is in a transition state where the voltage of the input signal transits from a high level to a low level and from the low level to the high level, the switches S1 and S3 are turned off and the switches S2 and S4 are turned on such that the amplified signal does not pass through the compensation capacitors CM1 and CM2. On the other hand, when the input signal of the operational amplifier 10 is in a steady state, the switches S1 and S3 are turned on and the switches S2 and S4 are turned off such that the amplified signals pass through the compensation capacitors CM1 and CM2, for performing frequency compensation for improving loop stability.

Please note that, when the input signal is in the transition state, the node A is connected to a power supply terminal VDD and the node C is connected to a ground terminal GND. In this situation, a voltage level of the node A is not equal to a steady state voltage level of the node B, and a voltage level of the node C is not equal to a steady state voltage level of the node D. Therefore, when the input signal is in the steady state and the switches S1 and S3 are turned on, charge sharing occurs between the nodes A and B and between the nodes C and D so that the voltage level of the node B is higher than the normal steady state voltage level and discharging occurs on the node B; and the voltage level of the node D is lower than the normal steady state voltage level and charging occurs on the node D. The discharging occurs on the node B and the charging occurs on the node D increase current consumption of the transistors MP6 and MN6.

From the above, the charging and discharging effects occurring on the nodes B and D when the input signal is in the steady state results in unnecessary current consumption and thereby extends the settling time of the operational amplifier 10. In addition, switching of the switches S1-S4 is controlled by an external circuit, which limits the application of the operational amplifier 10.

SUMMARY OF THE INVENTION

It is therefore a primary objective of the claimed invention to provide a rail-to-rail operational amplifier capable of reducing current consumption.

The present invention discloses a rail-to-rail operational amplifier capable of reducing current consumption. The rail-to-rail operational amplifier comprises an amplification stage circuit, an output stage circuit and a compensation circuit. The amplification stage circuit comprises a first compensation output terminal, a second compensation output terminal, a first current output terminal and a second current output terminal, and is utilized for generating an amplified signal according an input signal of the rail-to-rail operational amplifier. The output stage circuit is coupled to the first current output terminal and the second current output terminal of the amplification stage circuit, and comprises an output terminal, for outputting the amplified signal. The compensation circuit is coupled to the amplification stage circuit and the output stage circuit, and comprises a first voltage generator, a second voltage generator, a first compensation capacitor, a second compensation capacitor, a first switch, a second switch, a third switch and a fourth switch.

The first voltage generator is utilized for generating a first voltage approximately equal to a steady state voltage of the first compensation output terminal of the amplification stage circuit. The second voltage generator is utilized for generating a second voltage approximately equal to a steady state voltage of the second compensation output terminal of the amplification stage circuit. The first compensation capacitor comprises a first terminal and a second terminal coupled to the output terminal of the output stage circuit. The second compensation capacitor comprises a first terminal and a second terminal coupled to the output terminal of the output stage circuit.

The first switch is coupled between the first compensation output terminal and the first terminal of the first compensation capacitor, and is utilized for selectively coupling the first compensation output terminal to the first terminal of the first compensation capacitor according to a first control signal. The second switch is coupled between the first voltage generator and the first terminal of the first compensation capacitor, and is utilized for selectively coupling the first voltage generator to the first terminal of the first compensation capacitor according to a second control signal. The third switch is coupled between the second compensation output terminal and the first terminal of the second compensation capacitor, and is utilized for selectively coupling the second compensation output terminal to the first terminal of the second compensation capacitor according to a third control signal. The fourth switch is coupled between the second voltage generator and the first terminal of the second compensation capacitor, and is utilized for selectively coupling the second voltage generator to the first terminal of the second compensation capacitor according to a fourth control signal.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
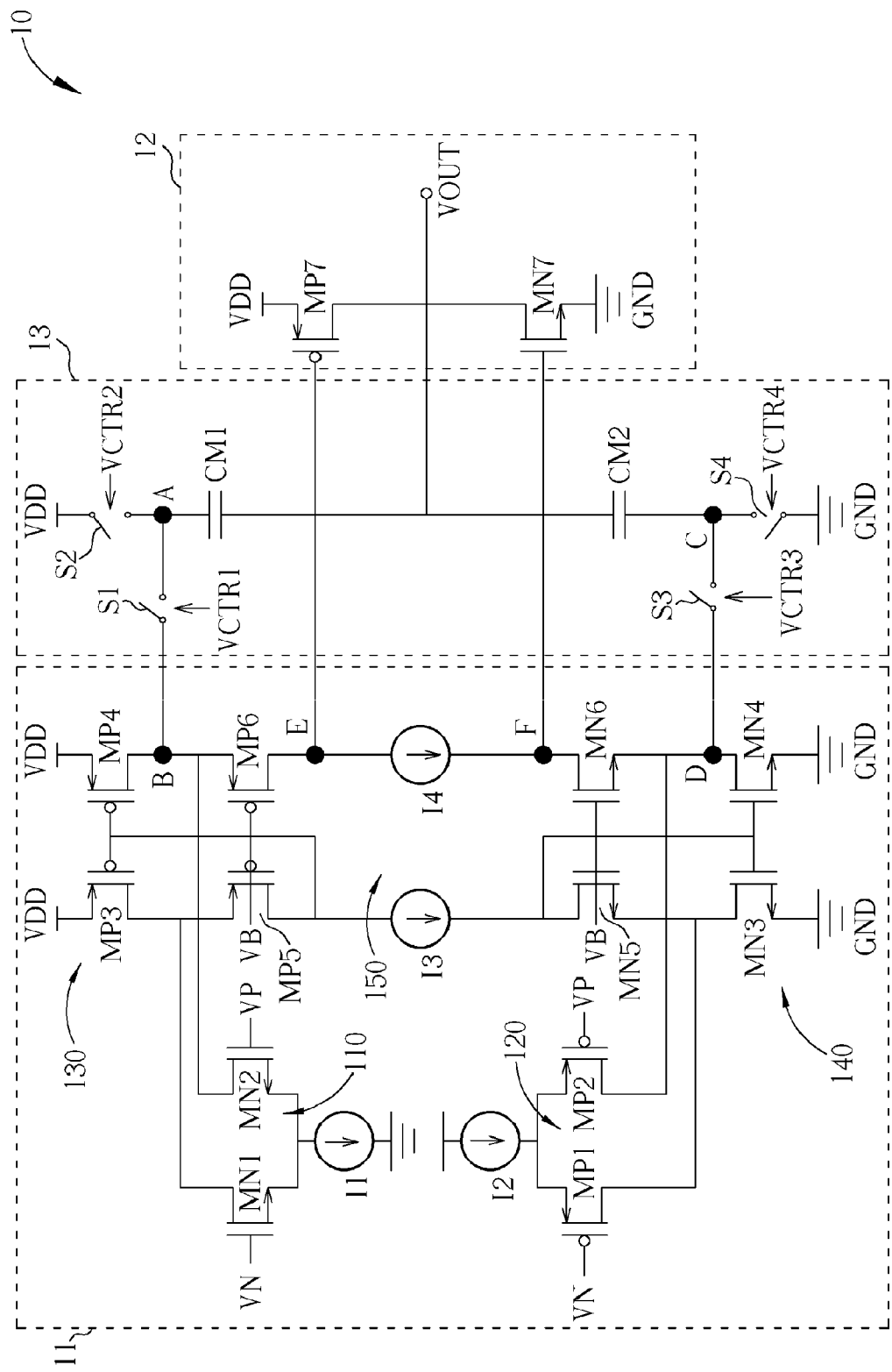
FIG. 1 is a schematic diagram of an operational amplifier according to the prior art.
Figure 2:
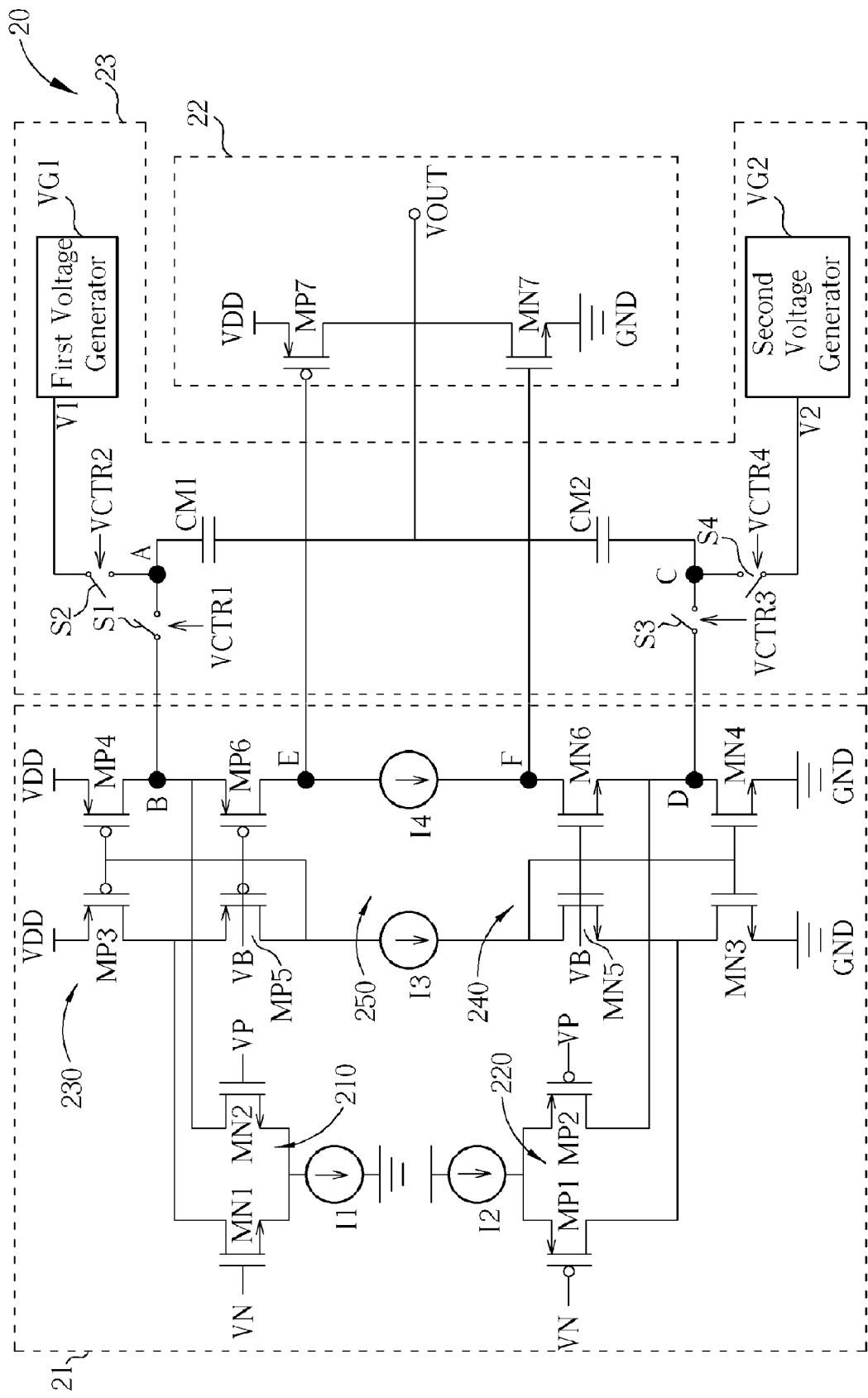
FIG. 2 to FIG. 5 are schematic diagrams of operational amplifiers according to embodiments of the present invention.

Please refer to FIG. 2, which is a schematic diagram of an operational amplifier 20 according to an embodiment of the present invention. The operational amplifier 20 is a rail-to-rail operational amplifier, and comprises an amplification stage circuit 21, an output stage circuit 22 and a compensation circuit 23. The operational amplifier 20 receives an input signal via a positive input terminal VP, outputs an amplified signal via an output terminal VOUT and forms a feedback path from the output terminal VOUT to a negative input terminal VN. The amplification stage circuit 21 comprises a first differential input pair 210, a second differential input pair 220, a first current mirror 230, a second current mirror 240 and a third current mirror 250, and is utilized for generating the amplified signal according to the input signal. The output stage circuit 22 is a push-pull output circuit. The output stage circuit 22 comprises a PMOS transistor MP7, an NMOS transistor MN7 and an output terminal VOUT and is utilized for outputting the amplified signal. Current sources 11-14, PMOS transistors MP1-MP7 and NMOS transistors MN1-MN7 in the amplification stage circuit 21 and the output stage circuit 22 are similar to those in the amplification stage circuit 11 and the output stage circuit 12 shown in FIG. 1.

The amplification stage circuit 21 comprises a first compensation output terminal, a second compensation output terminal, a first current output terminal and a second current output terminal, which correspond to nodes B, D, E and F respectively. Gates of the transistors MP7 and MN7 are respectively coupled to the nodes E and F. The compensation circuit 23 is coupled to the nodes B, D and the output terminal VOUT, and comprises a first voltage generator VG1, a second voltage generator VG2, compensation capacitors CM1 and CM2 and switches S1, S2, S3 and S4. The first voltage generator VG1 is utilized for generating a first voltage V1, which is approximately equal to a steady state voltage of the node B. The second voltage generator VG2 is utilized for generating a second voltage V2, which is approximately equal to a steady state voltage of the node D. The compensation capacitor CM1 comprises a first terminal coupled to the switch S2 and a second terminal coupled to the output terminal VOUT. The compensation capacitor CM2 comprises a first terminal coupled to the switch S4 and a second terminal coupled to the output terminal VOUT. In the operational amplifier 20, the compensation capacitors CM1 and CM2 are charged and discharged according to switching of switches S1-S4, which helps loop stability.

Connections and operations of the switches S1-S4 are further described as follows. The switch S1 is coupled between the node B and the first terminal of the compensation capacitor CM1, and is utilized for selectively coupling the node B to the first terminal of the compensation capacitor CM1 according to a control signal VCTR1. The switch S2 is coupled between the first voltage generator VG1 and the first terminal of the compensation capacitor CM1, and is utilized for selectively coupling the first voltage generator VG1 to the first terminal of the compensation capacitor CM1 according to a control signal VCTR2. The switch S3 is coupled between the node D and the first terminal of the compensation capacitor CM2, and is utilized for selectively coupling the node D to the first terminal of the compensation capacitor CM2 according to a control signal VCTR3. The switch S4 is coupled between the second voltage generator VG2 and the first terminal of the compensation capacitor CM2, and is utilized for selectively coupling the second voltage generator VG2 to the first terminal of the compensation capacitor CM2 according to a control signal VCTR4.

When the input signal of the operational amplifier 20 is in a transition state, which is a state the input signal transits from a high level to a low level and transits from the low level to the high level, the switches S1 and S3 are turned off respectively according to the control signals VCTR1 and VCTR3, and the switches S2 and S4 are turned on respectively according to the control signals VCTR2 and VCTR4. In this situation, the amplified signal outputted from the amplification stage circuit 21 does not pass through the compensation capacitors CM1 and CM2. When the input signal of the operational amplifier 20 is in a steady state, the switches S1 and S3 are turned on respectively according to the control signals VCTR1 and VCTR3, and the switches S2 and S4 are turned off respectively according to the control signals VCTR2 and VCTR4, thus the amplified signal passes through the compensation capacitors CM1 and CM2 and frequency compensation is performed.

Note that, in the embodiment of the present invention, the first voltage V1 generated by the first voltage generator VG1 is approximately equal to the steady state voltage of the node B, and the second voltage V2 generated by the second voltage generator VG2 is approximately equal to the steady state voltage of the node D. Therefore, when the input signal of the operational amplifier 20 is in a steady state, a voltage level of the node A approaches the voltage level of the node B and a voltage level of the node C approaches the voltage level of the node D, so that charge sharing does not occur between the nodes A and B and between the nodes C and D. In other words, there is no charging or discharging on the nodes B and D, which helps decreasing unnecessary current consumption of the transistors MP6 and MN6. Compared with the prior art, the embodiment of the present invention decreases current consumption of the operational amplifier 20 and does not increase the settling time.

Please note that, the present invention aims to control the voltages generated by the first voltage generator VG1 and the second voltage generator VG2 to avoid charging and discharging occurring on the nodes B and D when the input signal is in the steady state. Embodiments of the first voltage generator VG1 and the second voltage generator VG2 are described as follows, and those skilled in the art can make alterations and modifications accordingly.

Figure 3:
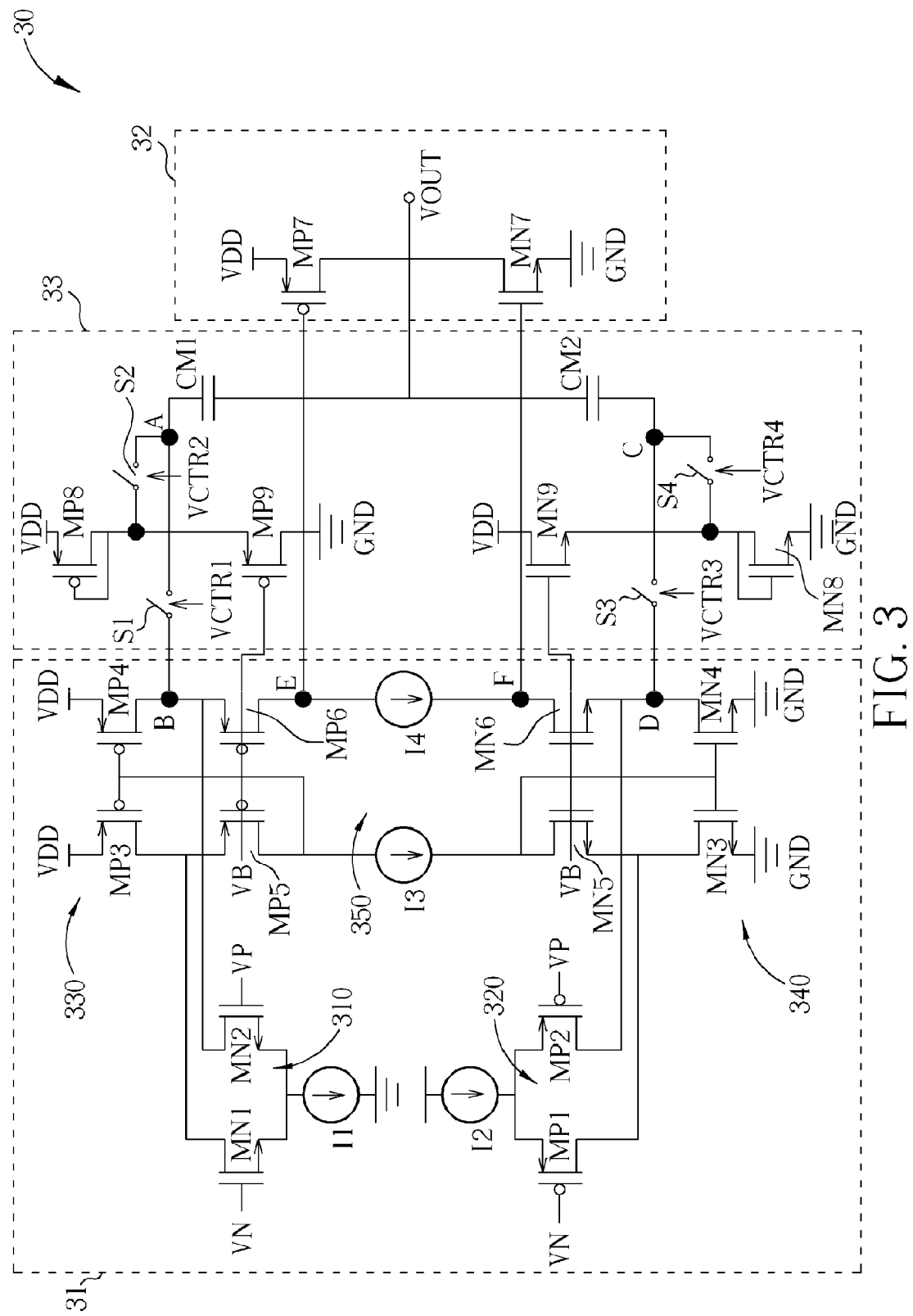

Please refer to FIG. 3, which is a schematic diagram of an operational amplifier 30 according to an embodiment of the present invention. FIG. 3 further illustrates an embodiment of the first voltage generator VG1 and the second voltage generator VG2. Similar to the operational amplifier 20, the operational amplifier 30 comprises an amplification stage circuit 31, an output stage circuit 32 and a compensation circuit 33. As shown in FIG. 3, the first voltage generator VG1 comprises PMOS transistors MP8 and MP9 and the second voltage generator VG2 comprises NMOS transistors MN8 and MN9. The transistor MP8 has a source coupled to a power supply terminal VDD, and a gate and a drain both coupled to the switch S2, in which gate voltage and drain voltage are both equal to the first voltage V1 which is equal to the steady state voltage of the node B. The transistor MP9 has a source coupled to the gate and the drain of the transistor MP8, a drain coupled to a ground terminal GND and a gate coupled to a bias VB in the amplification stage circuit 31. The transistor MN8 has a source coupled to the ground terminal GND, a gate and a drain both coupled to the switch S4, in which gate voltage and drain voltage are both equal to the second voltage V2 which is equal to the steady state voltage of the node D. The transistor MN9 has a source coupled to the gate and the drain of the transistor MN8, a drain coupled to the power supply terminal VDD and a gate coupled to the bias VB.

Operations of the switches S1-S4 in the compensation circuit 33 is similar to those in the compensation circuit 23 shown in FIG. 2. Therefore, when the input signal of the operational amplifier 30 is in a steady state, a voltage level of the node A approaches the voltage of the node B and a voltage level of the node C approaches the voltage of the node D. That is, there is no charging or discharging on the nodes B and D. Current consumption of the transistors MP6 and MN6 in the operational amplifier 30 is therefore decreased.

Figure 4:
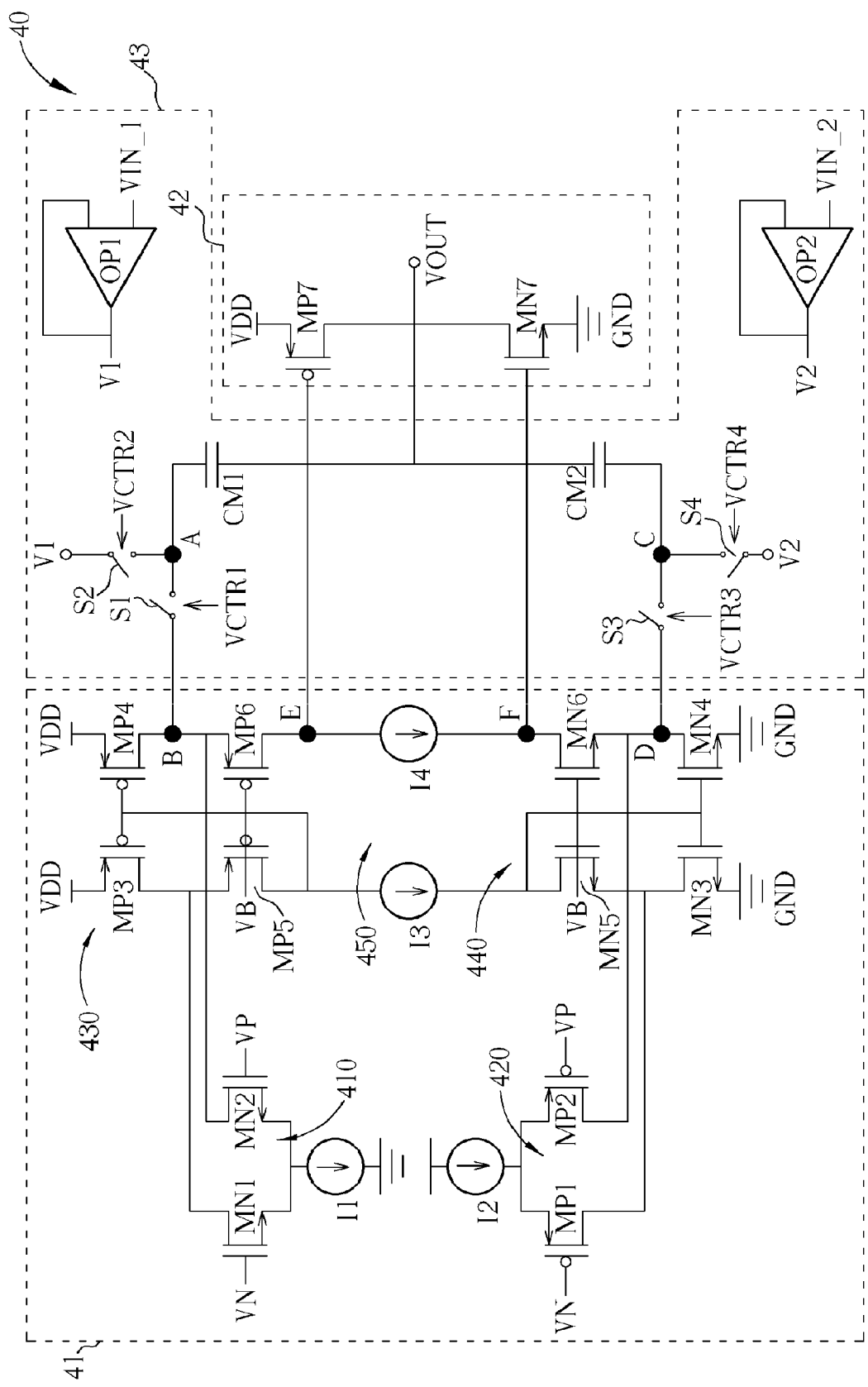

Pleas refer to FIG. 4, which is a schematic diagram of an operational amplifier 40 according to an embodiment of the present invention. FIG. 4 further illustrates another embodiment of the first voltage generator VG1 and the second voltage generator VG2. Similar to the operational amplifier 20, the operational amplifier 40 comprises an amplification stage circuit 41, an output stage circuit 42 and a compensation circuit 43. Different from FIG. 3, the first voltage generator VG1 and the second voltage generator VG2 are respectively implemented by unit gain operational amplifiers OP1 and OP2 in which an output voltage is equal to an input voltage. Operations of the switches S1-S4 in the compensation circuit 43 is similar to those in the compensation circuit 23 shown in FIG. 2. Therefore, when an input voltage VIN_1 of the unit gain operational amplifier OP1 is designed to be approximately equal to the steady state voltage of the node B and an input voltage VIN_2 of the unit gain operational amplifier OP2 is designed to be approximately equal to the steady state voltage of the node D, charging sharing does not occur between the nodes A and B and between the nodes C and D when the input signal is in the steady state. In other words, there is no charging or discharging on the nodes B and D; current consumption of the transistors MP6 and MN6 in the operational amplifier 40 is therefore decreased.

Figure 5:
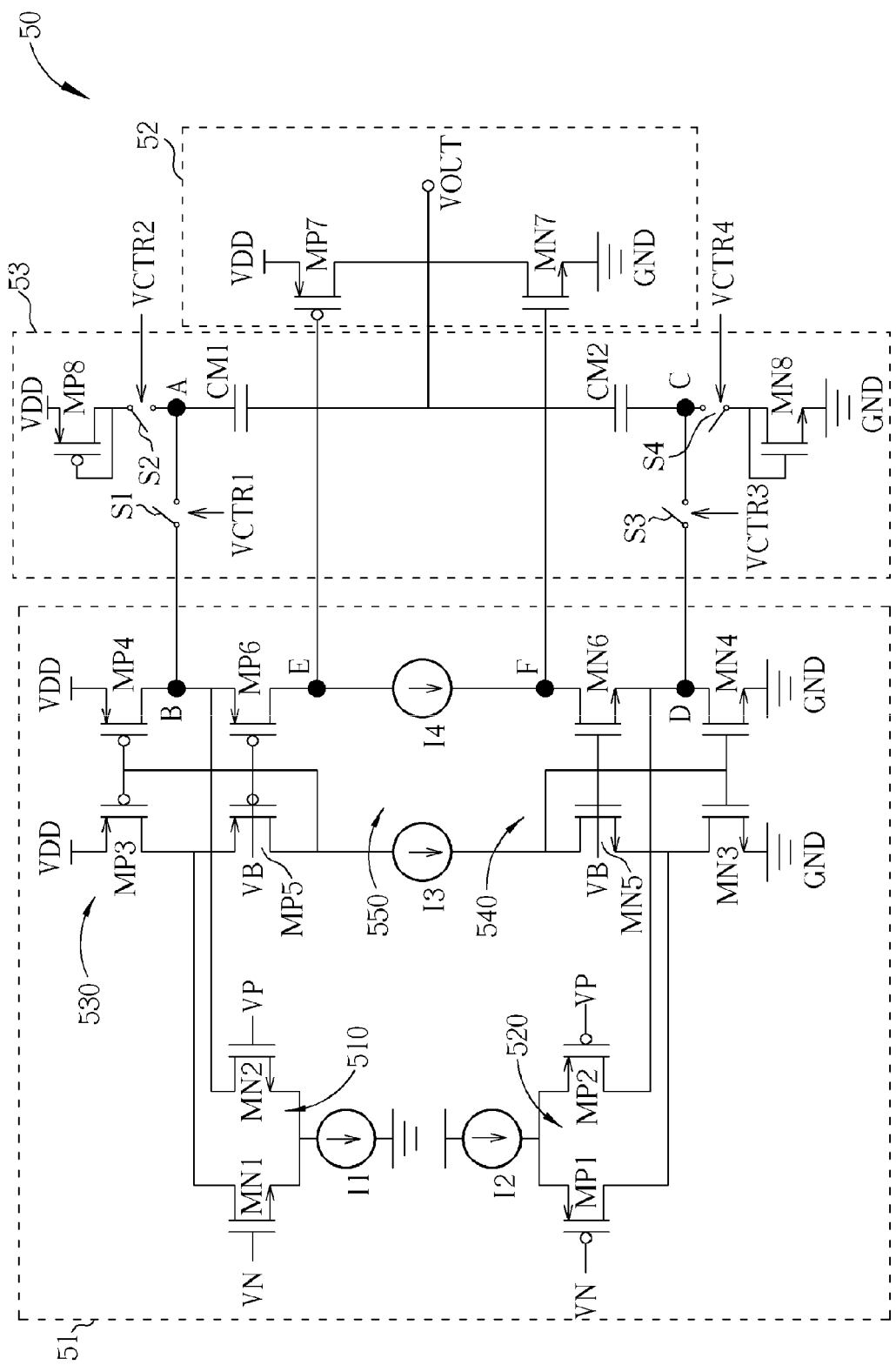

Note that, operations of the switches S1-S4 in the operational amplifiers 20, 30 and 40 is one of embodiments of the present invention, and those skilled in the art can make alterations and modifications accordingly. Please refer to FIG. 5, which is a schematic diagram of an operational amplifier 50 according to an embodiment of the present invention. Similar to the operational amplifier 30 in FIG. 3, the operational amplifier 50 comprises an amplification stage circuit 51, an output stage circuit 52 and a compensation circuit 53. The difference is that, in FIG. 5, the first voltage generator VG1 only comprises the transistor MP8 (without MP9) and the second voltage generator VG2 only comprises the transistor MN8 (without MN9).

Furthermore, operations of the switches S1-S4 in the operational amplifier 50 is different from that in the operational amplifiers 20, 30 and 40. When the input signal of the operational amplifier 50 is in a transition state from a low level to a high level, the switches S1 and S4 are turned on respectively according to the control signals VCTR1 and VCTR4, and the switches S2 and S3 are turned off respectively according to the control signals VCTR2 and VCTR3. On the other hand, when the input signal is in a transition state from the high level to the low level, the switches S1 and S4 are turned off respectively according to the control signals VCTR1 and VCTR4, and the switches S2 and S3 are turned on respectively according to the control signals VCTR2 and VCTR3. In addition, when the input signal is in a steady state, the switches S1 and S3 are turned on respectively according to the control signals VCTR1 and VCTR3, and the switches S2 and S4 are turned off respectively according to the control signals VCTR2 and VCTR4, thus the amplified signal passes through the compensation capacitors CM1 and CM2 and the amplified signal is therefore compensated.

As mentioned previously, switching of the switches S1-S4 in a conventional amplifier is controlled by an external circuit. In comparison, the embodiment of the present invention further generates the control signals of the switches according to internal signals of the operational amplifier. Please refer to FIG. 6, which is a schematic diagram of a signal generation device 60 according to an embodiment of the present invention. The signal generation device 60 is installed in the operational amplifier, such as the operational amplifier 20, 30 or 40, for generating the control signals VCTR1-VCTR4.

Take the operational amplifier 20 in the FIG. 2 as an example to describe the signal generation device 60 as follows. The signal generation device 60 comprises a first comparator 600, a second comparator 602 and a NOR gate 604. The first comparator 600 is utilized for comparing a voltage level of the node E with a reference voltage Vref_A, for generating a comparison value OUT_A. Similarly, the second comparator 602 is utilized for comparing a voltage level of the node F with a reference voltage Vref_B, for generating a comparison value OUT_B. The NOR gate 604 is utilized for performing a logic operation on the comparison values OUT_A and OUT_B for generating a switch signal SW. The switch signal SW is utilized for generating the control signals VCTR1-VCTR4.

Criteria for the switch signal SW are described as follows. When the input signal of the operational amplifier 20 transits from the low level to the high level, the voltage level of the node E shall be decreased for increasing the voltage level of the output terminal VOUT. When the voltage level of the node E is lower than the reference voltage Vref_A, the switch signal SW has to control the switches S1 and S3 to turn off and control the switches S2 and S4 to turn on to make the compensation circuit 23 open, so that the amplified signal does not pass through the compensation circuit 23 and the slew rate of the operational amplifier 20 is therefore enhanced. Similarly, when the input signal of the operational amplifier 20 transits from the high level to the low level, the voltage level of the node F shall be increased for decreasing the voltage level of the output terminal VOUT. When the voltage level of the node F is higher than the reference voltage Vref_B, the switch signal SW has to control the switches S1 and S3 to turn off and control the switches S2 and S4 to turn on to make the compensation circuit 23 open to enhance the slew rate.

When the input signal of the operational amplifier 20 is in the steady state, the node E is in the steady state and the voltage level of the node E is higher than the reference voltage Vref_A; the node F is also in the steady state and the voltage level of the node F is lower than the reference voltage Vref_B. In this situation, the switch signal SW has to control the switches S1 and S3 to turn on and control the switches S2 and S4 to turn off. As a result, the amplified signal passes through the compensation capacitors CM1 and CM2 for frequency compensation, and the circuit will be stable.

In order to generate the switch signal SW and generate the control signals VCTR1-VCTR4 accordingly, operations of the first comparator 600, the second comparator 602 and the NOR gate 604 shall be implemented according to the above.

Figure 7:
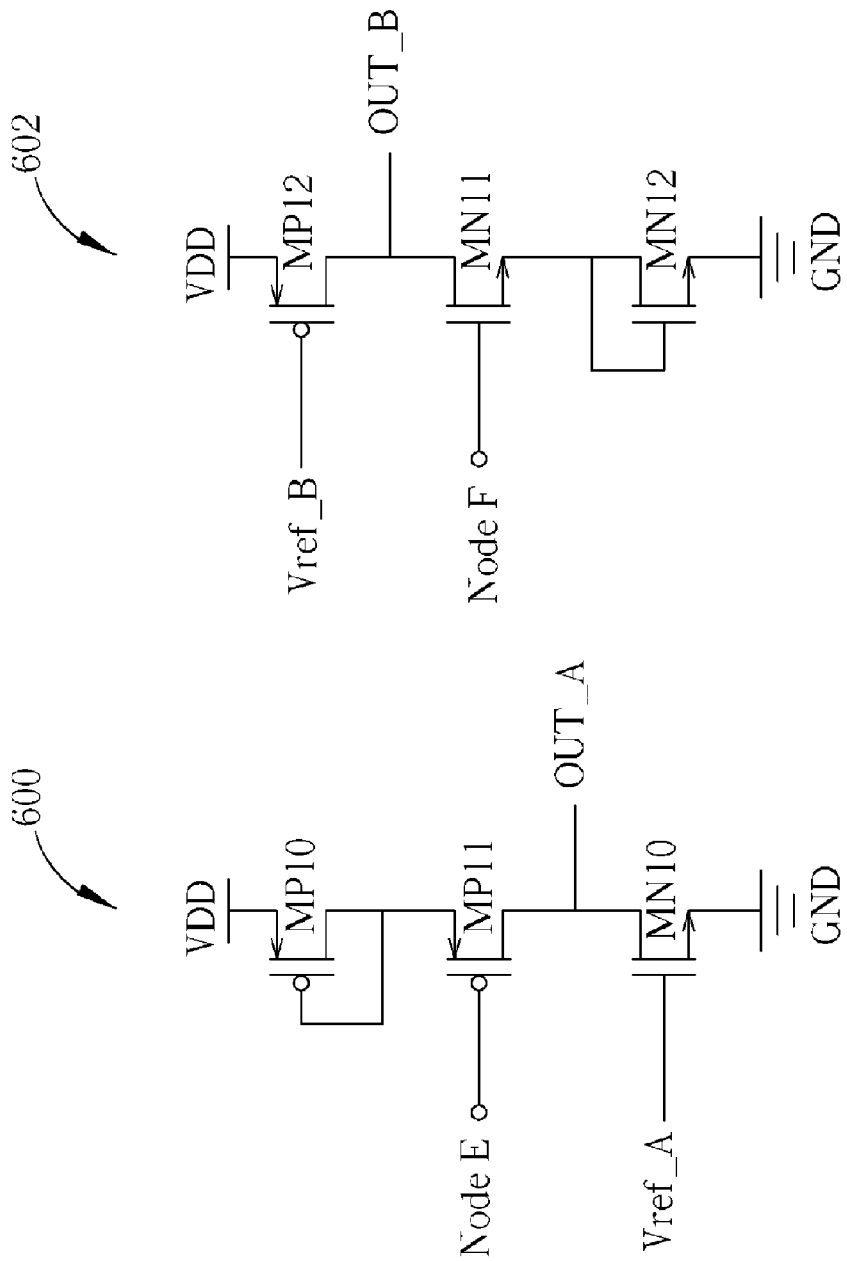
FIG. 7 is a schematic diagram of comparators shown in FIG. 6.

Please refer to FIG. 7, which is a schematic diagram of the first comparator 600 and the second comparator 602. In FIG. 7, the first comparator 600 comprises PMOS transistors MP10, MP11 and an NMOS transistor MN10. The transistor MP10 has a source coupled to the power supply terminal VDD, a gate, and a drain coupled to the gate. The transistor MP11 has a source coupled to the gate and the drain of the transistor MP10, a gate coupled to the node E, and a drain coupled to the NOR gate 604, in which drain voltage of the transistor MP11 is the comparison value OUT_A. The transistor MN10 has a drain coupled to the drain of the transistor MP11 and the NOR gate 604, a gate having a voltage equal to the reference voltage Vref_A, and a source coupled to the ground terminal GND.

The second comparator 602 comprises a PMOS transistor MP12, NMOS transistors MN11 and MN12. The transistor MP12 has a source coupled to the power supply terminal VDD, a gate having a voltage equal to the reference voltage Vref_B, and a drain coupled to the NOR gate 604, in which drain voltage of the transistor MP12 is the comparison value OUT_B. The transistor MN11 has a drain coupled to the drain of the transistor MP12 and the NOR gate 604, and a gate coupled to the node F. The transistor MN12 has a drain and a gate both coupled to the source of the transistor MN11, and a source coupled to the ground terminal GND.

Figure 6:
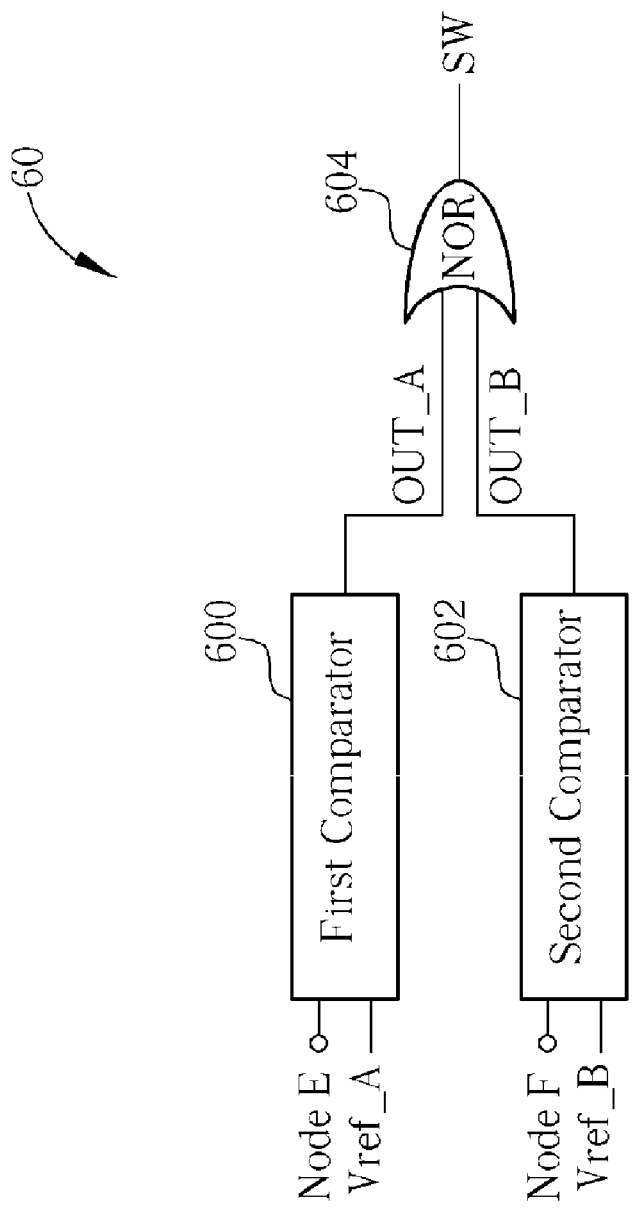
FIG. 6 is a schematic diagram of a signal generation device for generating control signals according to an embodiment of the present invention.

Please refer to FIG. 6 and FIG. 7. When the voltage level of the node E is lower than the reference voltage Vref_A and is low enough, the transistor MP10 is turned on and the comparison value OUT_A is pulled to a high level. When the voltage level of the node F is higher than the reference voltage Vref_B and is high enough, the transistor MN12 is turned on and the comparison value OUT_B is pulled to a low level. When the above two conditions occur, the NOR gate 604 performs a logic operation on the comparison values OUT_A and OUT_B to generate the switch signal SW. In this situation, the control signals VCTR1-VCTR4 generated according to the switch signal SW can control the switches S1 and S3 to turn off and control the switches S2 and S4 to turn on. On the other hand, when the input signal of the operational amplifier 20 is in the steady state, the nodes E and F are also in the steady state and therefore the transistors MP10 and MN12 are turn off. In this situation, the control signals VCTR1-VCTR4 can control the switches S1 and S3 to turn on and control the switches S2 and S4 to turn off.

From the above, the control signals VCTR1-VCTR4 are generated according to the switch signal SW, which is an internal signal generated by the circuit of the first comparator 600, the second comparator 602 and the NOR gate in the operational amplifier according to the embodiment of the present invention. Please note that, the first comparator 600 and the second comparator in FIG. 7 is one of embodiments of the present invention, and the switch signal SW can be generated by other circuits in the operational amplifier.

In conclusion, the embodiment of the present invention controls the bias of the compensation capacitors of the operational amplifier to avoid charging and discharging occurring between the amplification stage circuit and the compensation capacitor when the input signal is in the steady state. In addition, the embodiment of the present invention generates the control signals according to the internal signals in the operational amplifier instead of the external signals. Compared with the prior art, the embodiment of the present invention avoids unnecessary current consumption and enhances flexibility of the use of the operational amplifier.

Those skilled in the art will readily observe that numerous modifications and alterations of the device and method may be made while retaining the teachings of the invention.

What is claimed is:

1. A rail-to-rail operational amplifier capable of reducing current consumption comprising:
   an amplification stage circuit comprising a first compensation output terminal, a second compensation output terminal, a first current output terminal and a second current output terminal, for generating an amplified signal according an input signal of the rail-to-rail operational amplifier;
   an output stage circuit coupled to the first current output terminal and the second current output terminal of the amplification stage circuit, comprising an output terminal, for outputting the amplified signal; and
   a compensation circuit coupled to the amplification stage circuit and the output stage circuit, comprising:
      a first voltage generator for generating a first voltage approximated to a steady state voltage of the first compensation output terminal of the amplification stage circuit;

a second voltage generator for generating a second voltage approximated to a steady state voltage of the second compensation output terminal of the amplification stage circuit;

a first compensation capacitor comprising a first terminal and a second terminal coupled to the output terminal of the output stage circuit;

a second compensation capacitor comprising a first terminal and a second terminal coupled to the output terminal of the output stage circuit;

a first switch coupled between the first compensation output terminal and the first terminal of the first compensation capacitor, for selectively coupling the first compensation output terminal to the first terminal of the first compensation capacitor according to a first control signal;

a second switch coupled between the first voltage generator and the first terminal of the first compensation capacitor, for selectively coupling the first voltage generator to the first terminal of the first compensation capacitor according to a second control signal;

a third switch coupled between the second compensation output terminal and the first terminal of the second compensation capacitor, for selectively coupling the second compensation output terminal to the first terminal of the second compensation capacitor according to a third control signal; and a fourth switch coupled between the second voltage generator and the first terminal of the second compensation capacitor, for selectively coupling the second voltage generator to the first terminal of the second compensation capacitor according to a fourth control signal.

2. The rail-to-rail operational amplifier of claim 1, wherein when the input signal is in a transition state, the first switch and the third switch are turned off, and the second switch and the fourth switch are turned on; and when the input signal is in a steady state, the first switch and the third switch are turned on, and the second switch and the fourth switch are turned off.

3. The rail-to-rail operational amplifier of claim 1, wherein when the input signal is in a transition state from a low level to a high level, the first switch and the fourth switch are turned on, and the second switch and the third switch are turned off; when the input signal is in a transition state from the high level to the low level, the first switch and the fourth switch are turned off, and the second switch and the third switch are turned on; and when the input signal is in a steady state, the first switch and the third switch are turned on, and the second switch and the fourth switch are turned off.

4. The rail-to-rail operational amplifier of claim 1, wherein the first voltage generator comprises a first PMOS transistor having a source coupled to a power supply terminal, a gate coupled to the second switch and a drain coupled to the second switch, gate voltage and drain voltage equal to the first voltage.

5. The rail-to-rail operational amplifier of claim 4, wherein the first voltage generator further comprises a second PMOS transistor having a source coupled to the gate and the drain of the first PMOS transistor, a drain coupled to a ground terminal and a gate coupled to the amplification stage circuit.

6. The rail-to-rail operational amplifier of claim 1, wherein the second voltage generator comprises a first NMOS transistor having a source coupled to a ground terminal, a gate coupled to the fourth switch and a drain coupled to the fourth switch, gate voltage and drain voltage equal to the second voltage.

7. The rail-to-rail operational amplifier of claim 6, wherein the second voltage generator further comprises a second NMOS transistor having a source coupled to the gate and the drain of the first NMOS transistor, a drain coupled to a power supply terminal and a gate coupled to the amplification stage circuit.

8. The rail-to-rail operational amplifier of claim 1, wherein the first voltage generator is a unit gain operational amplifier, an input voltage of the unit gain operational amplifier equal to the first voltage.

9. The rail-to-rail operational amplifier of claim 1, wherein the second voltage generator is a unit gain operational amplifier, an input voltage of the unit gain operational amplifier equal to the second voltage.

10. The rail-to-rail operational amplifier of claim 1 further comprising:

a first comparator, for comparing a voltage of the first current output terminal with a first reference voltage, for generating a first comparison value;

a second comparator, for comparing a voltage of the second current output terminal with a second reference voltage, for generating a second comparison value; and a NOR gate, for generating a switch signal, which is utilized for generating the first control signal, the second control signal, the third control signal and the fourth control signal, according to the first comparison value and the second comparison value.

11. The rail-to-rail operational amplifier of claim 10, wherein when voltage of the first current output terminal is lower than the first reference voltage, the first switch and the third switch are turned off, and the second switch and the fourth switch are turned on.

12. The rail-to-rail operational amplifier of claim 10, wherein when voltage level of the second current output terminal is higher than the second reference voltage, the first switch and the third switch are turned off, and the second switch and the fourth switch are turned on.

13. The rail-to-rail operational amplifier of claim 10, wherein the first comparator comprising:

a first PMOS transistor having a source coupled to a power supply terminal, a gate, and a drain coupled to the gate;

a second PMOS transistor having a source coupled to the drain of the first PMOS transistor, a gate coupled to the first current output terminal, and a drain coupled to the NOR gate; and a first NMOS transistor having a drain coupled to the drain of the second PMOS transistor and the NOR gate, a gate having a voltage equal to the first reference voltage, and a source coupled to a ground terminal.

14. The rail-to-rail operational amplifier of claim 10, wherein the second comparator comprising:

a first PMOS transistor having a source coupled to a power supply terminal, a gate having a voltage equal to the second reference voltage, and a drain coupled to the NOR gate;

a first NMOS transistor having a drain coupled to the drain of the first PMOS transistor and the NOR gate, a gate coupled to the second current output terminal, and a source; and a second NMOS transistor having a drain coupled to the source of the first NMOS transistor, a gate coupled to the drain, and a source coupled to a ground terminal.

* * * * *